(12) United States Patent
Arakawa et al.

(10) Patent No.: US 9,299,578 B2
(45) Date of Patent: Mar. 29, 2016

(54) TRANSISTOR FORMATION METHOD USING SIDEWALL MASKS

(75) Inventors: Hideki Arakawa, Kawasaki (JP); Takuo Ito, Kawasaki (JP)

(73) Assignee: Cypress Semiconductor Corporation, San Jose, CA (US)

( * ) Notice: Subject to any disclaimer, the term of this patent is extended or adjusted under 35 U.S.C. 154(b) by 630 days.

(21) Appl. No.: 11/317,083

(22) Filed: Dec. 21, 2005

(65) Prior Publication Data

US 2006/0276032 A1 Dec. 7, 2006

Related U.S. Application Data

(63) Continuation of application No. PCT/JP2004/019646, filed on Dec. 28, 2004.

(51) Int. Cl.
| | |
|---|---|
| *H01L 21/4763* | (2006.01) |
| *H01L 21/308* | (2006.01) |
| *H01L 21/033* | (2006.01) |
| *H01L 21/311* | (2006.01) |
| *H01L 21/3213* | (2006.01) |

(52) U.S. Cl.
CPC ........ *H01L 21/3088* (2013.01); *H01L 21/0337* (2013.01); *H01L 21/0338* (2013.01); *H01L 21/3086* (2013.01); *H01L 21/31144* (2013.01); *H01L 21/32139* (2013.01)

(58) Field of Classification Search
CPC ............ H01L 21/0337; H01L 21/0338; H01L 21/32139; H01L 21/3088; H01L 21/31144; H01L 21/3086
USPC ................... 438/637; 257/E21.575, E21.249, 257/E21.613
See application file for complete search history.

(56) References Cited

U.S. PATENT DOCUMENTS

| | | | |
|---|---|---|---|
| 4,648,937 A | 3/1987 | Ogura et al. | |
| 6,872,647 B1 * | 3/2005 | Yu et al. | 438/585 |
| 6,967,140 B2 * | 11/2005 | Doyle | 438/282 |

(Continued)

FOREIGN PATENT DOCUMENTS

| | | |
|---|---|---|
| EP | 0 402 296 | 12/1990 |
| JP | 3-023673 | 1/1991 |

(Continued)

OTHER PUBLICATIONS

Sung et al.; "Fabrication and Program/Erase Characteristics of 30-nm SONOS Novolatile Memory Devices", 2003 IEEE Trjansactions on Nanotechnology, vol. 2, No. 4, Dec. 2003.

(Continued)

*Primary Examiner* — Walter H Swanson

(57) ABSTRACT

There is provided a method of fabricating a semiconductor device including forming a first film on a base layer, forming a first mask pattern on the first film, the first mask pattern having mask portions arranged at a given pitch, forming first sidewall films on sidewalls of the first mask pattern by etchback of a deposited second film, removing the first mask pattern, and forming a second mask pattern composed of the first sidewall films and second sidewall films defined by etchback of a deposited third film. It is possible to form a stripe pattern with the line width and the line space thereof having the same sizes and at a pitch the same as the minimum process size determined by the photolithographic performance, thereby enabling fabrication of a semiconductor device with a high degree of integration.

6 Claims, 19 Drawing Sheets

(56) References Cited

U.S. PATENT DOCUMENTS

| | | | |
|---|---|---|---|
| 7,435,536 B2* | 10/2008 | Sandhu et al. | 430/313 |
| 2005/0272259 A1* | 12/2005 | Hong | 438/669 |
| 2006/0046422 A1* | 3/2006 | Tran et al. | 438/401 |
| 2010/0203727 A1* | 8/2010 | Abatchev et al. | 438/689 |

FOREIGN PATENT DOCUMENTS

| JP | 8-055908 | 2/1996 |
|---|---|---|
| JP | 8-055920 | 2/1996 |
| JP | 10-294367 | 11/1998 |
| JP | 2000173979 | 6/2000 |
| JP | 7-245402 | 9/2005 |

OTHER PUBLICATIONS

Aritome et al.; "A 0.67 um2 Self-Aligned Shallow Trench Isolation Cell (Sa-Sti Cell) for 3V-only 256Mbit Nand Eeproms.", 1994 IEEE; IEDM 94-61; pp. 3.6.1-3.6.4.

International Search Report for International Application No. PCT/JP04/19646 dated Apr. 19, 2005; 4 pages.

Written Opinion of the International Searching Authority for International Application No. PCT/JP04/19646 dated Apr. 19, 2005; 3 pages.

* cited by examiner ( Prior Art )

TRANSISTOR FORMATION METHOD USING SIDEWALL MASKS

CROSS-REFERENCES TO RELATED APPLICATIONS

This is a continuation of International Application No. PCT/JP2004/019646, filed Dec. 28, 2004 which was not published in English under PCT Article 21(2).

BACKGROUND OF THE INVENTION

1. Field of the Invention

This invention relates generally to fabrication methods for semiconductor devices.

2. Description of the Related Art

It is well known that a non-volatile semiconductor memory includes cell transistors, wherein the floating gate and control gate are stacked and bit information is stored by storing charge in the floating gate and changing the threshold value of the transistor. Flash memories are widely used non-volatile semiconductor memories which are electrically erasable in a block. There are NOR type, NAND type, AND type, and DINOR type flash memories, identified by the connection type of the cell transistors. With the increased capacity of flash memories in recent years, the NAND-type flash memories are generally employed for highly integrating cell transistors (Aritome, S, et. al. 1994 International Electron Devices Meeting Technical Digest, pp. 271-274, December 1994). Also, a virtual ground type array of SONOS cells in which the charge is trapped in the insulating film instead of the floating gate are also known (Sung et al.: Fabrication and Program/Erase Characteristics of 30-nm SONOS Nonvolatile Memory Devices, IEEE Transaction on Nanotechnology, vol. 2. no. 4, December 2003).

FIG. 1 is a plane view of a conventional NAND-type flash memory array. A plane pattern of the memory array includes a control gate 101 of a word line and a bit line 102, which are arranged to intersect each other. Floating gates 103 are provided in regions intersected by the aforementioned lines. An element isolation region 104 is provided to extend in a direction parallel to the word line 101 and located between the floating gates 103 so as to isolate the cell transistors arranged adjacently to each other. Shallow Trench Isolation (STI), utilized in miniaturized fabrication, is commonly employed for element isolation. An n-type diffusion layer to form the source/drain regions of the cell transistor is provided between the word lines 101 arranged adjacently to each other.

Therefore, the NAND-type flash memory has a string architecture in which the n-type transistors are connected in series and multiple strings are formed in parallel. One end of the NAND string is connected to a page buffer via a select transistor and the other end thereof is grounded to a common source region via another select transistor, not shown in FIG. 1 for simplification. In conventional fabrication methods, the line width and space of the STI, word line, and bit line are limited by a minimum process size of F, dependent on the photolithography characteristics. Hence, as shown in FIG. 1, F is the minimum size of the width and space respectively and 2F is the minimum pitch of the interconnection lines. Accordingly, $4F^2$ ($2F \times 2F$) is the minimum memory cell size.

Referring to FIGS. 2A to 2D, a description will be given of the conventional technique for processing a width narrower than the minimum process size of F. As shown in FIG. 2A, a silicon nitride film 106 is deposited on a base layer 105, and a mask pattern 107 of polysilicon is provided with a line width F and a space F. Next, as shown in FIG. 2B, after sidewalls 108 of silicon dioxide are formed on side walls, the mask pattern 107 is removed as shown in FIG. 2C. Then, the sidewalls 108 are used for the mask and the silicon nitride film 106 is etched. Subsequently, the sidewalls 108 are selectively removed, and the base layer 105 is etched with a silicon nitride film 106a used for the mask. As shown in FIG. 2D, a line pattern 105a with a width of x1, which is narrower than the minimum process size of F, is created, thereby forming two types of spaces between the lines, F and xs, where xs is narrower than F. The lines are arranged at an average pitch of F, however, the line spaces are not uniform.

It is to be noted that in conventional photolithography method with the minimum process size of F, F is the minimum width of the mask pattern used for forming the lines and F is the minimum space thereof. Therefore, it is impossible to accurately form lines haivng a width narrower than the aforementioned size with conventional fabrication techniques. In conventional techniques for forming the line pattern of the pitch F, the sidewall films formed on the side walls of the stripe pattern with the line width F and the space F are used for the mask, resulting in a constant line width. However, there is a problem in that the line space has two types. That is, it is difficult to make a high-density pattern with line width and line space of equal sizes. Accordingly, it is also difficult to reduce the costs of the NAND-type flash memory in which high-density cell arrays are demanded in view of the limitations on the process size due to the performance limitations of photolithography.

SUMMARY OF THE INVENTION

An object of the present invention is to solve the above-mentioned problems and provide a method for fabricating a highly integrated semiconductor device.

In order to -solve the above-described problems in accordance with an aspect of the present invention, there is preferably provided a method for fabricating a semiconductor device including forming a first film on a base layer, forming a first mask pattern on the first film, the first mask pattern having mask portions arranged at a given pitch, forming first sidewall films on sidewalls of the first mask pattern by etchback of a deposited second film, removing the first mask pattern, and forming a second mask pattern composed of the first sidewall films and second sidewall films defined by etchback of a deposited third film.

According to this first aspect of the present invention, it is possible to form a stripe pattern with the line width and the line space having the same sizes at a pitch that is the same as the minimum process size determined by the photolithographic performance, thereby enabling the fabrication of a semiconductor device with a high degree of integration.

According to another aspect of the present invention, there is preferably provided a method for fabricating a semiconductor device including forming a first film and a second film on a base layer in that order, forming a first mask pattern on the second film, the first mask pattern having mask portions arranged at a given pitch, forming first sidewall films on sidewalls of the first mask pattern by etchback of a deposited third film, forming a second mask pattern by etching the second film with the first sidewall films being used as a mask after removing the first mask pattern, forming second sidewall films on both sides of the second mask pattern by etchback of a deposited fourth film after removing the first sidewall films, and etching the second sidewall films so that the second sidewall films remain only on one side of the second mask pattern so that a third mask pattern is composed of the remaining second sidewall films and the second mask pattern.

According to this second aspect of the present invention, it is also possible to form a stripe pattern with the line width and the line space having the same sizes at a pitch that is the same as the minimum process size determined by the photolithographic performance, thereby enabling the fabrication of a semiconductor device with a high degree of integration.

DESCRIPTION OF THE PREFERRED EMBODIMENTS

Figure 1:
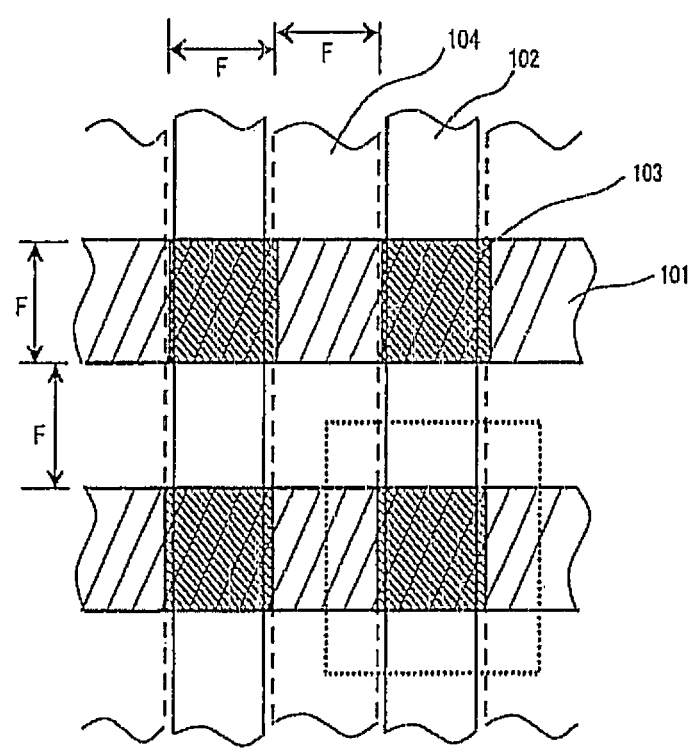
FIG. 1 is a plane view of a conventional NAND-type flash memory array.
Figure 2A:
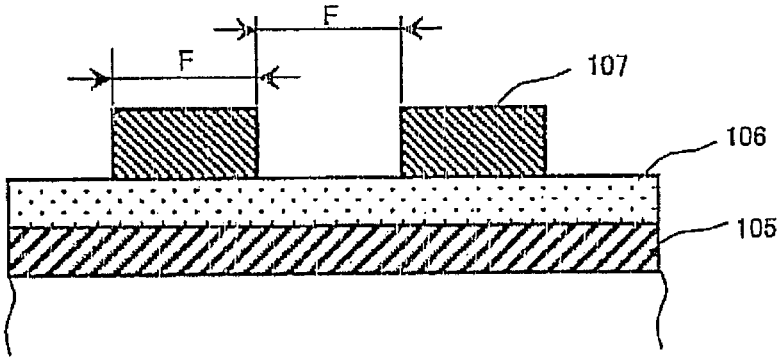
FIGS. 2A through 2D are cross-sectional views of a conventional semiconductor device during the fabrication process.
Figure 2B:
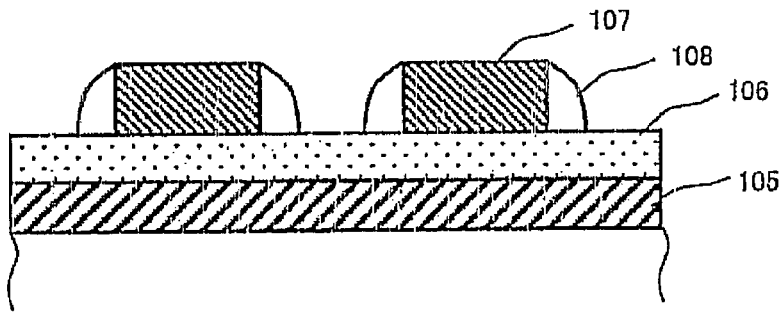
Figure 2C:
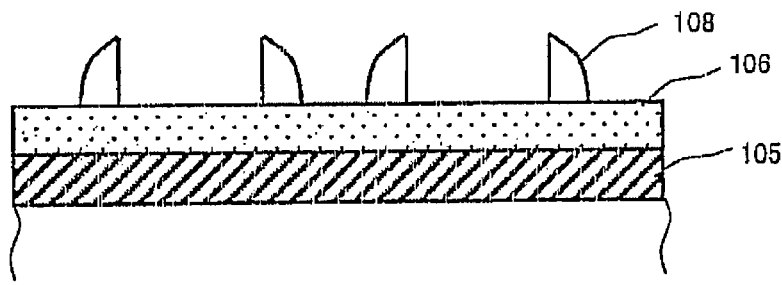
Figure 2D:
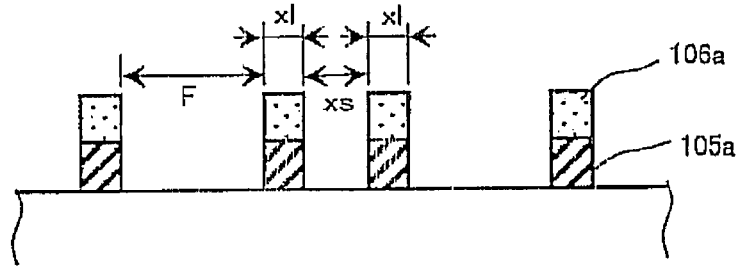

A description will now be given, with reference to the accompanying drawings, of embodiments of the present invention, with an example of a NAND-type flash memory. Here, the embodiments do not limit the technical scope of the present invention. In all drawings, the same components and configurations have the same reference numerals.

Figure 3:
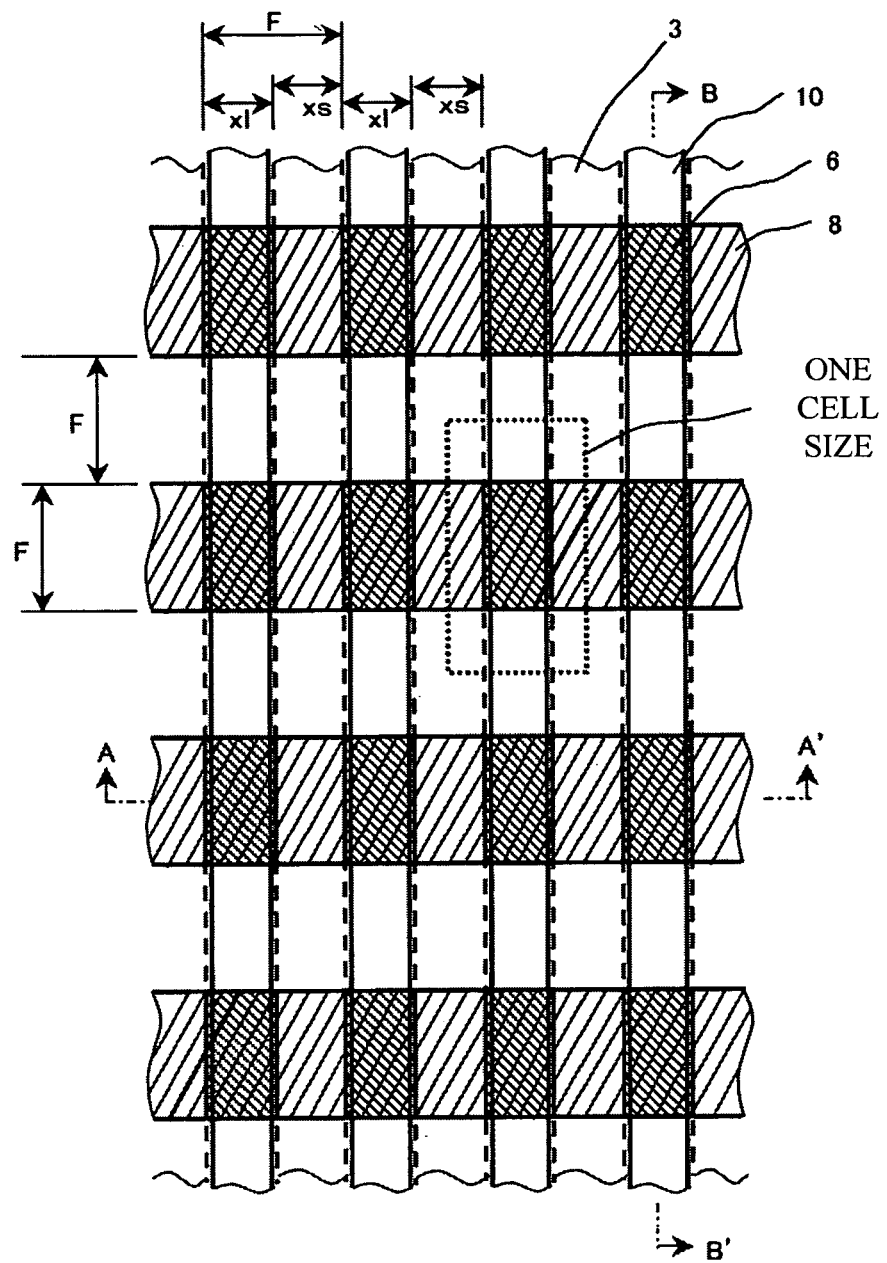
FIG. 3 is a plane view of a NAND-type flash memory array in accordance with a first embodiment of the present invention.
Figure 4:
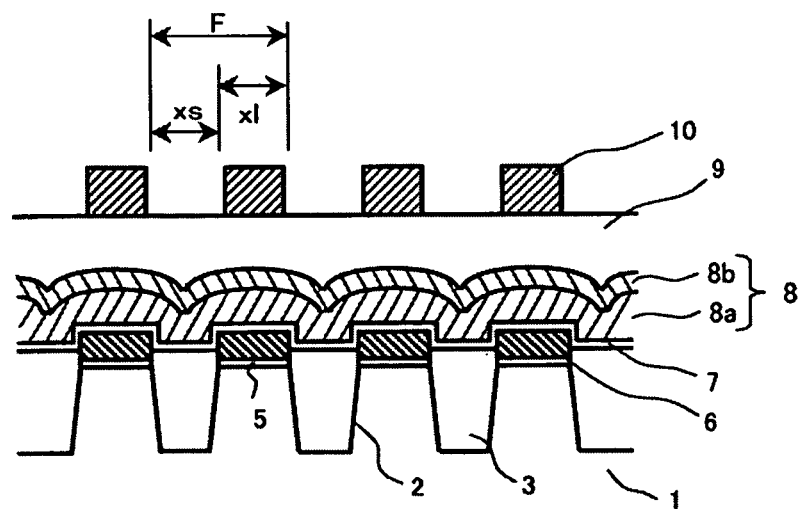
FIG. 4 is a cross-sectional view in accordance with the first embodiment of the present invention taken along a line A-A' shown in FIG. 3.
Figure 5:
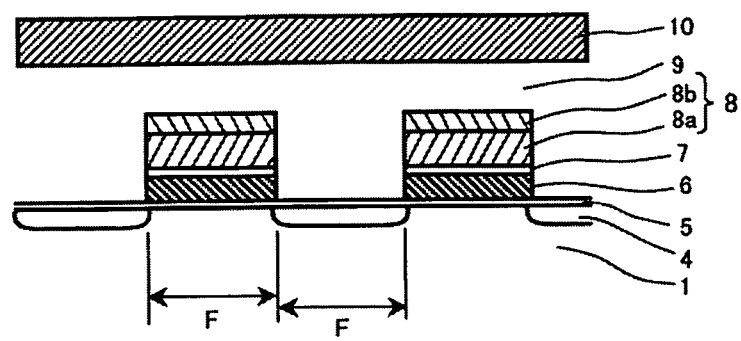
FIG. 5 is a cross-sectional view in accordance with the first embodiment of the present invention taken along a line B-B' shown in FIG. 3.

First Embodiment FIG. 3 is a plane view of the NAND-type flash memory array in accordance with a first embodiment of the present invention. FIG. 4 is a cross-sectional view taken along a line A-A' of FIG. 3. FIG. 5 is a cross-sectional view taken along a line B-B' of FIG. 3. As shown in FIG. 3, the memory cell array includes control gates 8 and bit lines 10, which are provided on a plane of the array to intersect with one another to form floating gates 6 at intersection regions thereof. Element isolation regions 3 are formed perpendicular to the control gates 8 and arranged between the floating gates 6 to isolate the cell transistors arranged adjacently to each other. As shown in FIG. 4, the memory cell array is formed on a surface of a silicon substrate 1. A trench 2 is formed on the silicon substrate 1 and an insulating film 3 for element isolation is buried inside the trench 2.

As shown in FIG. 5, an n-type diffusion layer 4 of the cell transistor is formed in the surface of the silicon substrate (semiconductor substrate) 1 and the cell transistors are connected in series. The gate insulating film 5, which is a tunnel oxide film, and the floating gates 6 are sequentially formed on the silicon substrate 1. The floating gates 6 are isolated for each memory cell and are made of polysilicon. The control gate 8 is formed above the floating gate 6 on a second gate insulating film 7 which comprises an ONO stack. Here, the ONO stack contains three layers composed of a silicon dioxide film, a silicon nitride film, and a silicon dioxide film, yet the ONO stack is shown as one layer in FIG. 5 for simplification.

The control gate 8 has a double-layer structure having a polysilicon film 8a and a tungsten silicide layer 8b corresponding to a word line. The bit line 10 is made of aluminum and formed on an interlayer insulating film (BPSG film) 9 made of BPSG (Boron Phosphorous Silicate Glass). A barrier metal layer of Ti/TiN is formed below the aluminum of bit line 10 and an antireflection film of TiN layer is provided on the aluminum, however these are not shown in FIGS. 4 and 5 for simplification.

As shown in FIG. 3, with respect to the memory cell array, $F=xs+xl$, where F denotes the minimum process size to be determined by the photolithographic performance, xs represents a line width of STI, and xl represents a line space of STI. The line width of STI and the line space of STI have the same sizes, and are arranged at a pitch of F. In this drawing, both xs and xl are shown as F/2. The bit line 10 has the same configuration in that it is formed to have a width of F/2. The word line 8 is formed with the use of the conventional fabrication technique so that the line width is F, the line space is F, and the pitch is 2F. Therefore, one cell size is $F \times 2F = 2F^2$.

A description will be given for a fabrication process of the bit line 10 with reference to FIGS. 6A through 6E and FIGS.

Figure 6A:
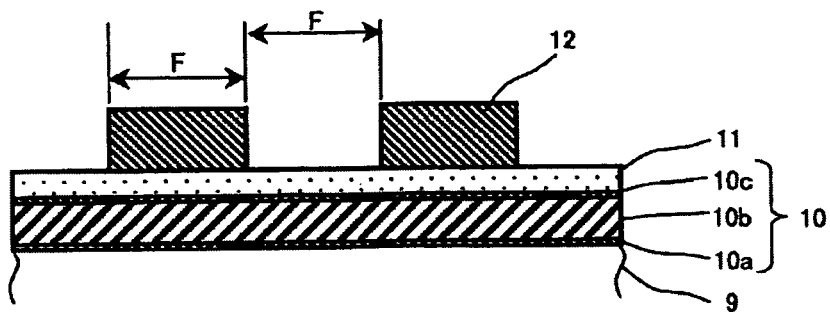
FIGS. 6A through 6E are cross-sectional views of the NAND-type flash memory array in accordance with the first embodiment of the present invention.

7F and 7G, in accordance with the first embodiment of fabricating the above-described NAND-type flash memory array in accordance with the present invention. Firstly, as shown in FIG. 6A, a Ti/TiN film 10a, an aluminum film 10b, and a TiN film 10c, serving as a base layer, are deposited on the BPSG film 9 deposited on the control gate. Then, a silicon nitride film (a first film) 11 is deposited on the base layer. It is preferable that the first film be an insulating film or polysilicon film.

Here, the silicon nitride film 11 is selected as a film to be formed on the bit line 10 of the base layer, yet the material of the first film is not limited to the silicon nitride, so long as the film provides a sufficient etch selectivity over the base layer. This is because the silicon nitride film 11 functions as a mask when the bit line 10 is etched by RIE (Reactive Ion Etching). Etch selectivity of one film material over another denotes that, as to the two film materials, one is hard to be etched and the other is easier to be etched.

Figure 6B:
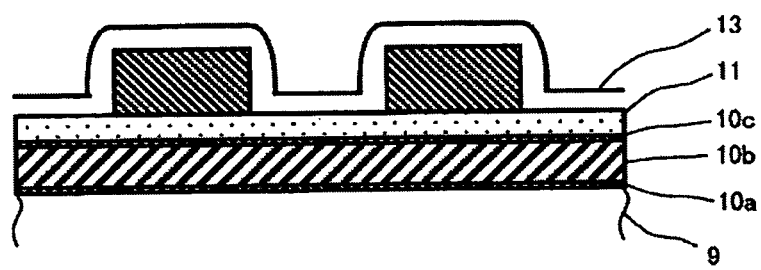
Figure 6C:
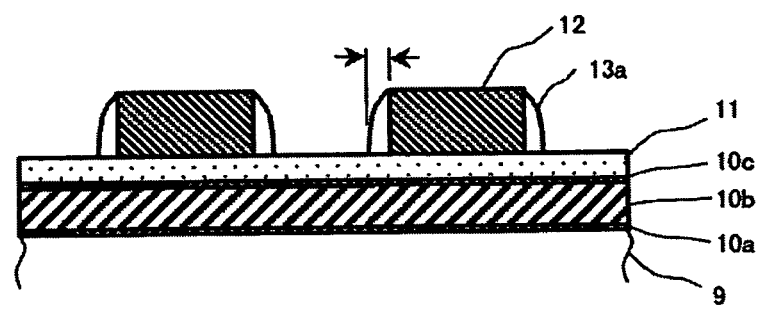

Next, in the photolithography method having the minimum process size of F, the mask pattern (a first mask pattern) 12 with a line width and space of F is formed with polysilicon film with a thickness of approximately F/2. The mask pattern 12 is formed on the silicon nitride film 11 at a given pitch and is made of a polysilicon film. The mask pattern 12 may be any insulating film. Then, as shown in FIG. 6B, a silicon dioxide film (a second film) 13 is deposited to the thickness of approximately F/4 by CVD (Chemical Vapor Deposition), and then, as shown in FIG. 6C, sidewall films (first sidewall films) 13a are formed on side walls of the mask pattern 12 through etch back by RIE. Here, the sidewall films 13a are formed to have a bottom width narrower than F/4. The RIE conditions, for example, are preferably a gas type/flow amount of CF4/CHF3/Ar=40/40/800 sccm, a pressure of 1.5 Torr, and an RF power of 500W. Preferably, the second film is an insulating or polysilicon film.

Figure 6D:
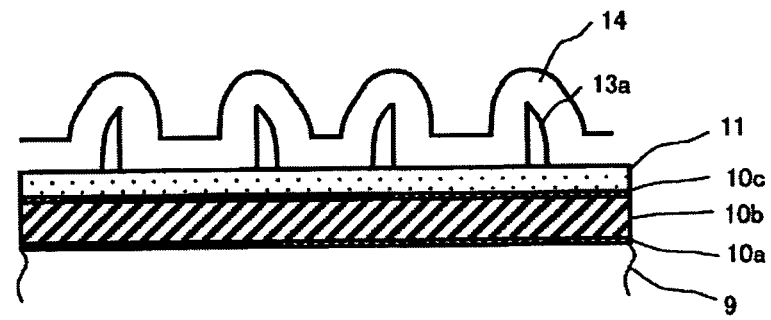

Next, the sidewall films 13a of the silicon dioxide film and the silicon nitride film 11 are etched in an etchant that can provide appropriate etch selectivity, and the mask pattern 12 of the polysilicon film is also selectively etched. Then, as shown in FIG. 6D, a silicon dioxide film (a third film) 14 is deposited by CVD to be thicker than that of the silicon dioxide film 13 (i.e., to be thicker than F/2). In the above-mentioned selective etching, an etch chemical comprising fluorinated nitric acid may be used. Alternatively, RIE may be utilized for the selective etching. And preferably, the third film is an insulating or polysilicon film.

Figure 6E:
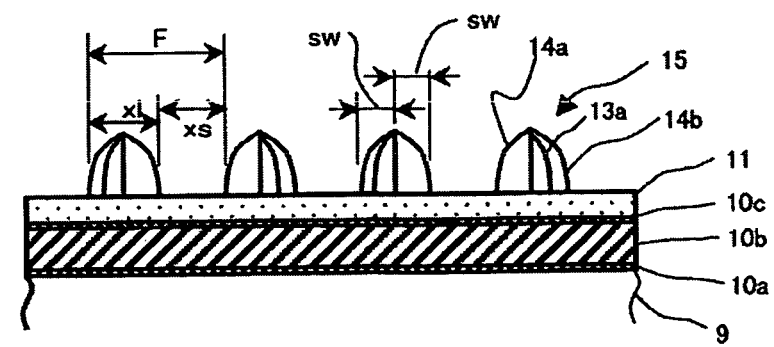

Subsequently, by etch back of the silicon dioxide film 14 by RIE, as shown in FIG. 6E, sidewall films (second sidewall films) 14a are formed on the vertical side surfaces of the sidewall films 13a, and sidewall films (the second sidewall films) 14b are formed on curved side surfaces of the sidewall films 13a. Here, the sidewall films 14a are formed to have a bottom width of F/4, and the sidewall films 14b are formed so that F/4 is a total of the bottom width of the sidewall films 13a and the sidewall films 14b. That is to say, the bottom width of the sidewall film 14a formed on the vertical side surface is substantially equal to a total of the bottom width of the sidewall film 14b and the sidewall film 13a. Also, as illustrated in the drawings, the sidewall film 14b is formed thinner than the sidewall film 14a. This is because the silicon dioxide film 14 is formed thicker on the vertical side surface of the sidewall film 13a than on the curved side surface thereof.

In summary, the method of forming the sidewall films 13a, 14a, and 14b, includes the following steps. (1) The secondly deposited silicon oxide film 14 is deposited thicker than the firstly deposited silicon oxide film 13. (2) The secondly deposited silicon oxide film 14 is etched back so that the sidewall film 14a may have a bottom width sw of F/4. (3) The thickness of the firstly deposited silicon oxide film 13 in (1) is determined in consideration of the bottom width of the sidewall film 14b formed by etching back the secondly deposited silicon oxide film 14. In this manner, by forming the three sidewall films 13a, 14a, and 14b, a mask pattern (a second mask pattern) 15 is formed to have the line width of F/2 and the space of approximately F/2.

In accordance with the present embodiment, a bottom width xl of the mask pattern 15 and a space xs are respectively configured to be approximately F/2. However, it is possible to form the mask pattern 15 with desired line width and space by adjusting the bottom widths of the aforementioned three sidewall films when they are formed.

Figure 7F:
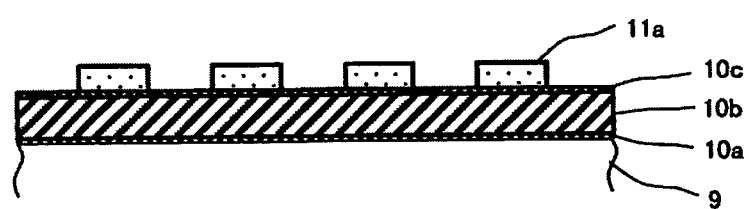
FIGS. 7F and 7G are cross-sectional views of the NAND-type flash memory array in accordance with the first embodiment of the present invention.
Figure 7G:
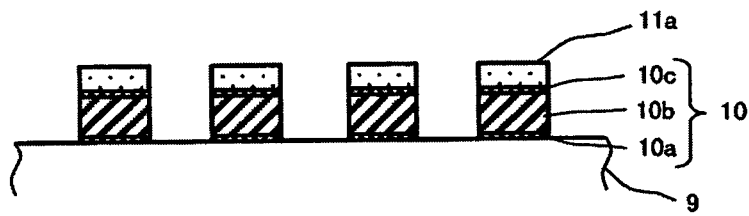

Next, the silicon nitride film 11 is etched by RIE with the use of the mask pattern 15. Then, the mask pattern 15 of the silicon oxide film is selectively etched and removed in an etchant solution of HF (fluorinated acid) or the like. As shown in FIG. 7F, a resulting mask pattern (a third mask pattern) 11a of the silicon nitride film is formed. Then, as shown in FIG. 7G, the bit line 10 is formed by etching the Ti/TiN film 10a, the aluminum film 10b, and the TiN film 10c, making up the base layer, by RIE with the use of the mask pattern 11a. Alternatively, the bit line 10 may be formed by etching the silicon nitride film 11, the Ti/TiN film 10a, the aluminum film 10b, and the TiN film 10c by RIE with the use of the mask pattern 15.

Thus, according to the bit line forming method in the NAND-type flash memory of the first embodiment, it is possible to form a microscopic pattern in which the pitch is F and the line width and line space have the same sizes, in the photolithography method of the minimum process size of F. The present invention is not limited to the bit line of the NAND-type flash memory, and may be applicable also to the word line thereof. Moreover, the present invention is applicable to forming the microscopic line pattern of any other semiconductor device in addition to a memory.

Second Embodiment

Figure 8A:
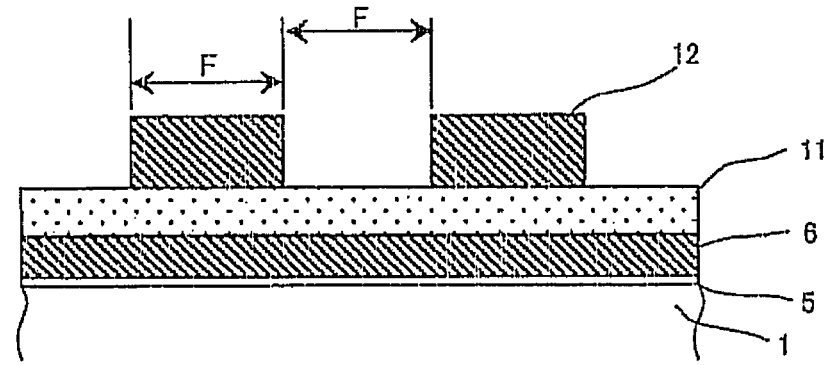
FIGS. 8A through 8D are cross-sectional views of the NAND-type flash memory array in accordance with a second embodiment of the present invention.
Figure 8B:
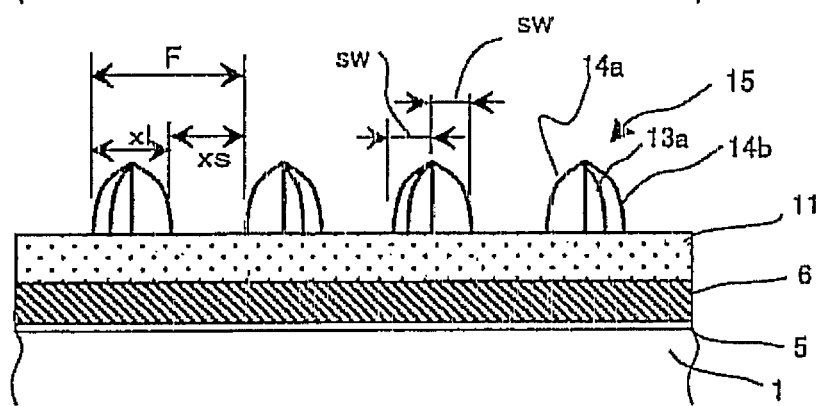

Next, a description will be given, with reference to FIGS. 8A through 8D and FIGS. 9E through 9G, of a second embodiment of the present invention for fabricating a NAND-type flash memory array. Firstly, as shown in FIG. 8A, there are provided the silicon dioxide film (a first gate insulating film) 5 to serve as a tunnel oxide film, the polysilicon film (a first conductive layer) 6 to serve as the floating gate, and the silicon nitride film 11, which films are successively deposited on the silicon substrate 1. The silicon dioxide film 5 and the polysilicon film 6 are base layers. The mask pattern 12 having the line width and space of the minimum process size of F is formed on the base layers with polysilicon film by the photolithography process. Next, as shown in FIG. 8B, in the same fabrication method as the method for fabricating the bit line as described above, the mask pattern 15 is formed to have the line width of approximately F/2 and the space of approximately F/2 by using the sidewall films 13a, 14a, and 14b.

Figure 8C:
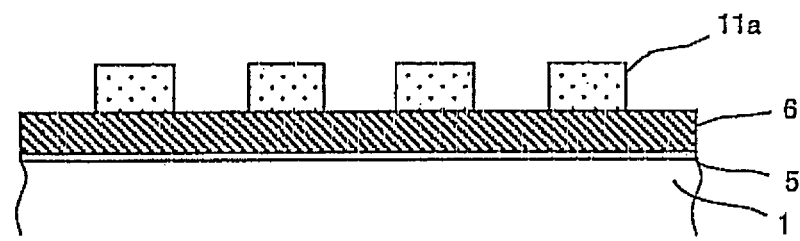
Figure 8D:
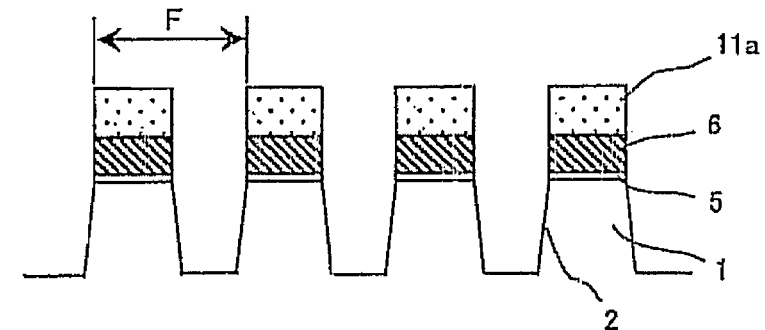

Then, after RIE by using the mask pattern 15, as shown in FIG. 8C, the mask pattern 15 of the silicon oxide film is etched away and removed in an etchant solution of HF or the like, and the mask pattern 11a of the silicon nitride film is formed. Here, the mask pattern 15, as will be described later, may remain without being etched. Next, as shown in FIG. 8D, the polysilicon layer 6, the silicon dioxide film 5, and the silicon substrate 1 are etched by RIE to form the floating gate 6 and the trench 2. In the process of etching the base layers with the use of the mask pattern 11a, etching proceeds to reach the silicon substrate 1 and forms the trench 2 therein. The depth of the trench 2 is determined by considering the punch-through resistance between elements adjacent to each other. It is desirable that the mask pattern 11a should have a thickness determined in relationship to the depth of the trench 2.

Figure 9E:
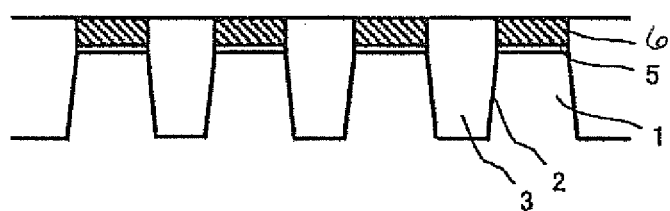
FIGS. 9E though 9G are cross-sectional views of the NAND-type flash memory array in accordance with the second embodiment of the present invention.

A silicon dioxide film is then deposited to bury the trench 2 by CVD. It is desirable that TEOS (Tetra Ethyl Ortho Silicate) which exhibits excellent step coverage should be employed for the silicon dioxide film. Then, by CMP (Chemical Mechanical Polishing), the mask pattern 11a of the silicon nitride. film is etched away and removed, and the silicon dioxide film buried in the trench forms STI 3, as shown in FIG. 9E. Therefore, if it is desired that the mask pattern 15 should remain without being etched, a structure similar to that shown in FIG. 9E is obtainable by etching the silicon nitride film 11 and the base layer 10 to reach the silicon substrate 1 and forming the trench during the process of etching with the use of the mask pattern 15.

Figure 9F:
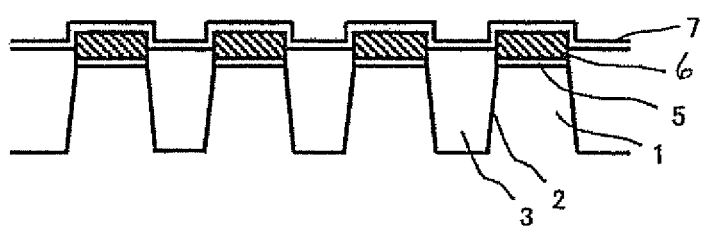
Figure 9G:
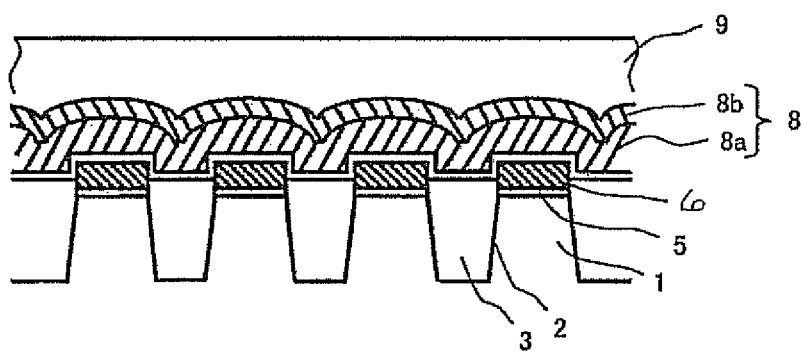

The silicon dioxide film in the vicinity of the surface of the STI 3 is etched in a diluted etchant solution of HF so that the exposed area of the floating gate 6 may be increased. This makes it possible to increase the coupling ratio between the floating gate 6 and the control gate 8 formed afterwards. Subsequently, as shown in FIG. 9F, the ONO stack 7 is formed as the second insulating film. For simplicity, in FIG. 9F, the three ONO layers are shown as one layer for simplification. Then, as shown in FIG. 9G, the polysilicon film 8a and the tungsten silicide (WSi) film 8b are sequentially deposited and processed by the photolithography process, thereby forming the control gate 8. In accordance with the present embodiment, the control gate 8 is formed in a known method to have the minimum process size of F. Then, the n-type diffusion layers to serve as the source/drain regions of the cell transistor are formed by ion implantation and the BPSG film 9 is deposited by CVD.

In accordance with the method for making the STI in the NAND type flash memory in accordance with the second embodiment by a photolithography process with the minimum process size of F, it is possible to obtain a microscopic pattern in which the line widths and the line spaces of the STI are respectively equal while, at the same time, it is possible to form the floating gate with an identical pattern.

In accordance with the first and second embodiments, a bit line and STI arranged at a pitch of F are obtainable. A memory array with a cell size of F×2F=2F$^2$ is also obtainable, as shown in FIG. 3, by arranging the word line at the pitch of 2F in the conventional fabrication method. This size is equal to half the size of the memory array fabricated in the conventional fabrication method.

Figure 14:
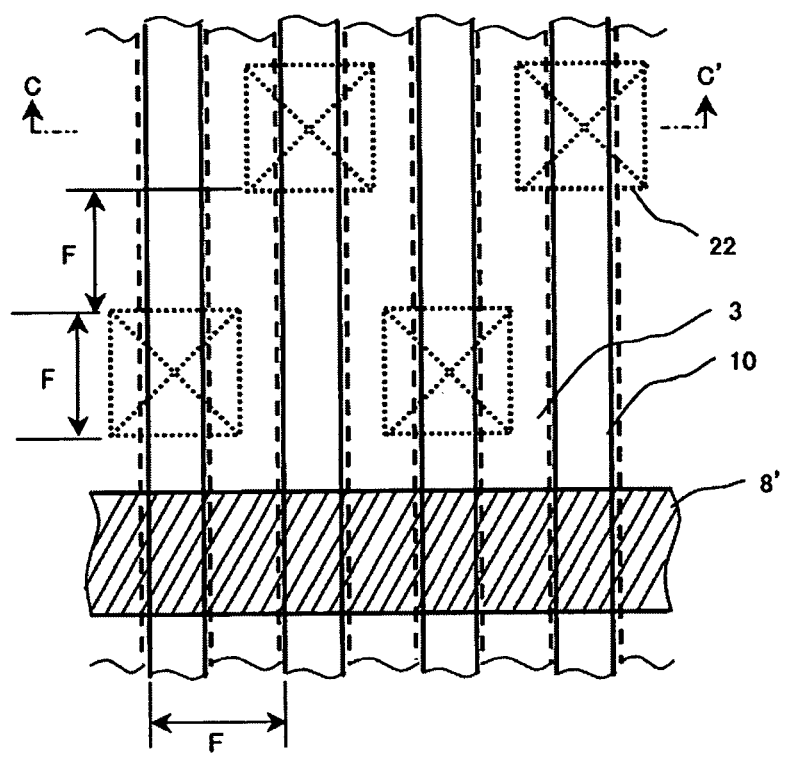
FIG. 14 is a plane view of a bit line contact in the NAND-type flash memory array in accordance with the second embodiment of the present invention.
Figure 15:
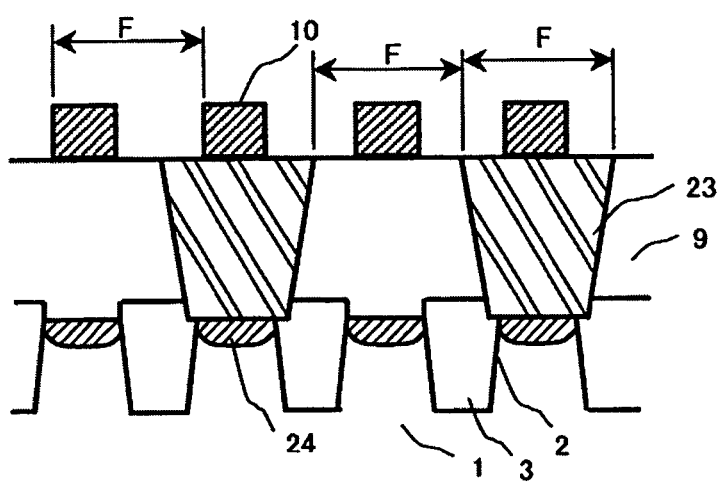
FIG. 15 is a cross-sectional view in accordance with the second embodiment of the present invention taken along a line C-C' shown in FIG. 14.

Hereinafter, a description will be given of the arrangement and fabrication method of bit line contacts in reference to FIGS. 14 and 15. FIG. 14 is a plane view of the bit line contacts and the vicinity thereof in the NAND type flash memory array in accordance with the second embodiment of the present invention. Generally, a select gate 8' is arranged on both sides of a pattern composed of a unit of sixteen word lines, not shown. On one side of the select gate 8', as shown, the bit line 10 is in contact with the substrate, namely, a drain diffusion layer. On the other side of the select gate 8', the unit of sixteen word lines having the select gate 8' on both sides thereof is arranged to establish a mirror symmetry sandwiching a common source region, the bit line contacts being provided on the edges thereof. Therefore, four select gates and thirty-two word lines are arranged between two contacts on the same bit line.

FIG. 14 shows contact portions 22 of the bit line and one select gate 8', for simplification. Adjacently provided bit lines are formed at a pitch of F and the contact portions are arranged in a zig-zag manner. This makes it possible to make a contact diameter of F and a space between the contact diameters at F in a conventional method. FIG. 15 is a cross-sectional view taken along a line C-C' shown in FIG. 14. A contact plug 23 of tungsten is provided inside the contact hole open through the BPSG 9 deposited on the substrate 1 with a diameter of F, so that the bit line 10 is connected to an n-type diffusion layer 24 serving as a drain region.

As described, the bit line contact is provided in a zig-zag manner, and the integration degree may be degraded slightly in the direction that the bit line extends. However, as described above, there are four select gates and thirty-two word lines arranged between two contacts on the same bit line. The influence on the degradation in the integration degree is practically small. In addition, the peripheral circuit has to be formed in accordance with the memory cell array. As is well known, with respect to the bit lines arranged at a small pitch, it is possible to fabricate the circuit provided in the page buffer by a conventional method by arranging the page buffers on both sides of the memory array and arranging the bit lines to be alternately connected to both page buffers.

With respect to the word line arranged at a small pitch, as is well known, it is possible to fabricate the circuit of the decoder by arranging the word decoders on both sides of the memory array and connecting the several word lines as a unit to both decoders alternately. However, the word decoder is driven by a voltage Vpp higher than a voltage Vcc used in a peripheral circuit such as the page buffer, thereby requiring a large transistor size.

Figure 10:
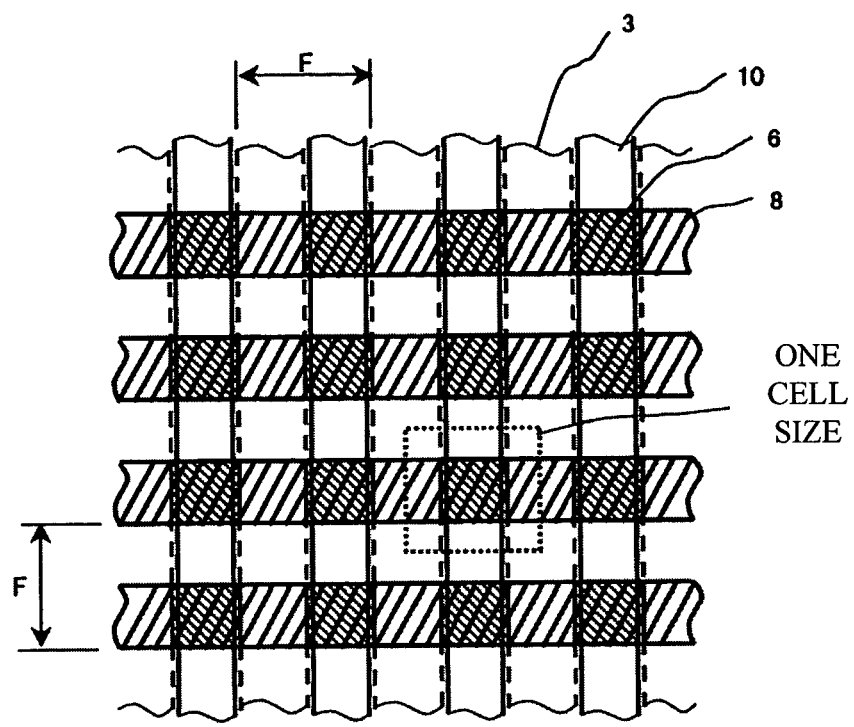
FIG. 10 is a plane view of the NAND-type flash memory array in accordance with the second embodiment of the present invention.

Accordingly, whether the word line is formed at the pitch of F may be determined by the trade off between the occupied area of the word decoder and the difficulty of the circuit fabrication method. FIG. 10 is a plane view of the NAND type flash memory that includes the word lines formed by the same fabrication method as described in regards to the first embodiment. One cell size is F$^2$, and this size is one-fourth of that fabricated in the conventional fabrication method.

In the first and second embodiments as described above, during the process of forming the mask pattern 15 at a pitch of F, even if an etchant has sufficient etch selectivity, there is the possibility that the silicon nitride film 11 provided on the base layer has a non-uniform surface. That is to say, referring back to FIGS. 6A through 6E as described in the first embodiment, the surface of the silicon nitride film 11 is slightly etched in the process of forming and removing the mask pattern 12 and in the process of forming and removing the sidewall films 13a, 14a, and 14b. The silicon nitride film 11 is used as the mask for fabricating the base layer by RIE. Therefore, it is desirable that the surface of the silicon nitride film 11 should, as much as possible, not be etched and be planar, before the mask pattern is formed. If the silicon nitride film 11 has a plane surface, it is possible to form the mask pattern 15 with high accuracy.

Preferably, the mask pattern 12 has the etch selectivity for the silicon nitride film 11 to serve as the first film, the silicon dioxide film 13 to serve as the second film has the etch selectivity for the silicon nitride film 11 to serve as the first film and the mask pattern 12, and the silicon oxide film 14 to serve as the third film has the etch selectivity for the nitride silicon film 11 to serve as the first film.

A description will now be given, with reference to FIGS. 11A through 11E, of the method for forming the STI of the NAND type flash memory, as a first variation example of the second embodiment.

Figure 11A:
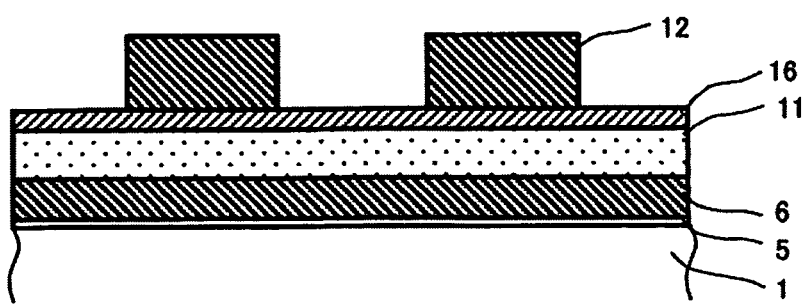
FIGS. 11A through 11E are cross-sectional views of the NAND-type flash memory array in accordance with a first variation example of the first embodiment of the present invention.
Figure 11B:
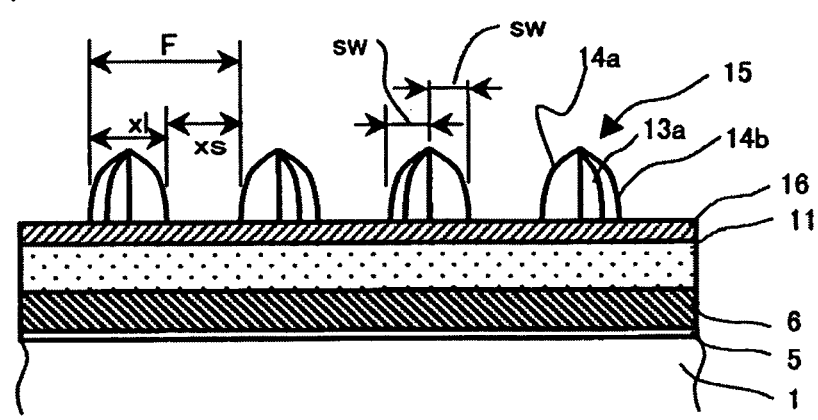

As shown in FIG. 11A, on the silicon substrate 1, the silicon dioxide film 5 serving as the tunnel oxide film, the polysilicon film 6 serving as the floating gate, the silicon nitride film 11, and a tungsten film 16 are sequentially deposited. Then, by the photolithography process, the mask pattern 12 with the line width and line space of the minimum process size of F is formed of polysilicon film to have the thickness of approximately F/2. Next, as shown FIG. 11B, the mask pattern 15 comprising three sidewall films 13a, 14a, and 14b is formed with silicon dioxide, by the fabrication method described in regards to the first embodiment.

The tungsten film 16 is used as a stopper film so that the silicon nitride film 11 provided on the base layer may not be etched during the etch process forming the mask pattern 15. Here, the tungsten film 16 is selected as a metal film that has a sufficient etch selectivity in relation to the polysilicon film 12, the silicon dioxide films 13 and 14, and the silicon nitride film 11 of the insulating films. Alternatively, any material may be employed instead of the tungsten film 16, if it has sufficient etch selectivity in relation the insulating films.

Figure 11C:
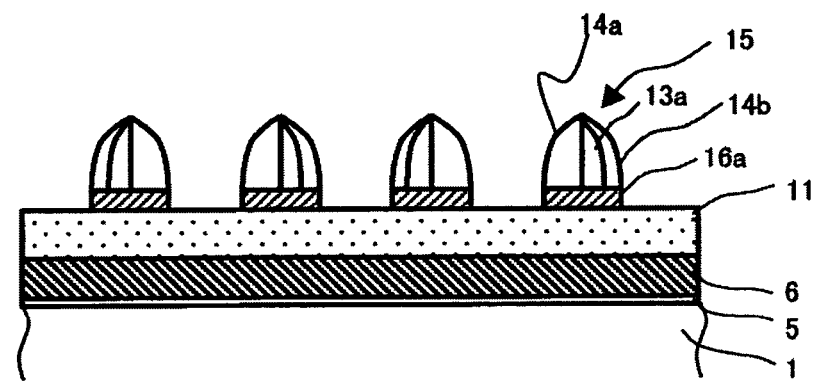
Figure 11D:
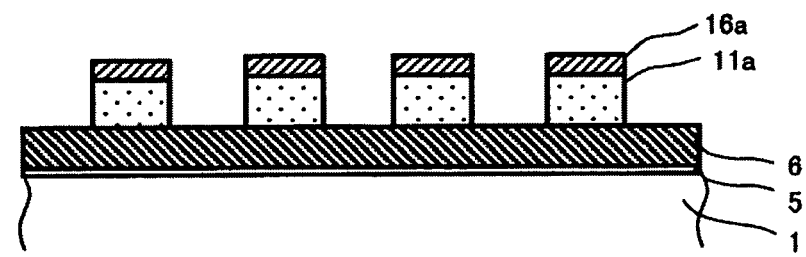
Figure 11E:
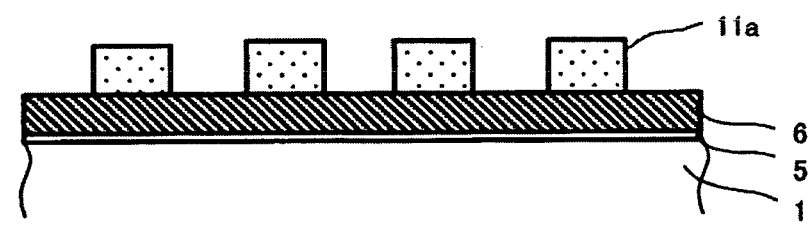

Then, as shown in FIG. 11C, the tungsten film 16 is etched with the mask pattern 15 by RIE to form a mask pattern (the third mask pattern) 16a. Next, the mask 15 of the silicon dioxide film is etched away in a HF solution. As shown in FIG. 11D, the silicon nitride film 11 is etched by RIE with the exposed tungsten film 16a as a mask to form a mask pattern (a fourth mask pattern) 11a in the silicon nitride film. Then, as shown in FIG. 11E, the tungsten film 16a is removed. The base layers 5 and 6 are etched with the use of the mask pattern 11a until the silicon substrate 1 is reached to form the trench.

As an alternate fabrication method, in FIG. 11C, the tungsten film 16 and the silicon nitride film 11 may be etched using the mask pattern 15 by RIE. Then, the mask pattern 15 and the tungsten film 16a that has been processed may be sequentially removed to form the mask pattern 11a. Subsequently, the STI and the floating gate are created in the fabrication method as described in the second embodiment above.

According to the first variation example of the second embodiment, during the process of forming the two mask patterns at a pitch of F, the surface of the silicon nitride film to serve as the mask used for processing of the base layer can be formed in a plane state before the base layer is processed, enabling an accurate subsequent etch process of the base layer.

In the present embodiment, the forming method of the STI has been described. This method is applicable to processing of any line such as the bit line.

The fabrication method has been described heretofore for obtaining a microscopic pattern by making the mask pattern at a pitch of F, for a mask to be used for etching the base layer in the lithography process with the minimum process size of F.

Figure 12A:
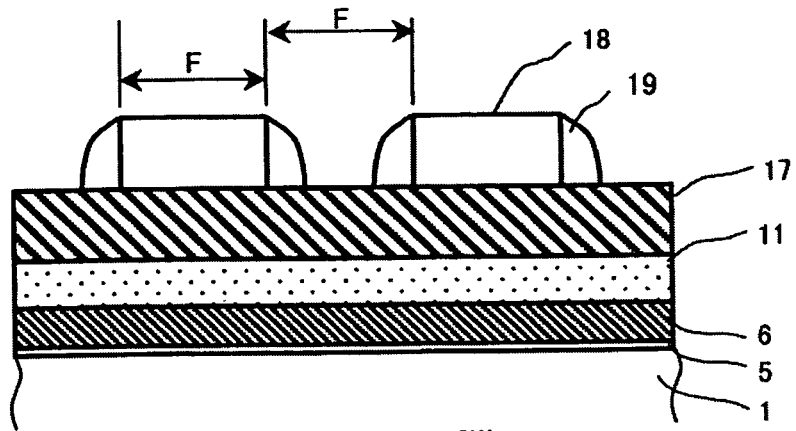
FIGS. 12A through 12D are cross-sectional views of the NAND-type flash memory array in accordance with a second variation example of the first embodiment of the present invention.

Next, a description will be given of another fabrication method of forming a mask pattern at a pitch of F. Here, a second variation example of the second embodiment will be described, taking as an example the method of forming the STI in a NAND type flash memory, with reference to FIGS. 12A through 12D, and 13E through 13H. Firstly, as shown in FIG. 12A, on the silicon substrate 1, the silicon dioxide film 5 serving as the tunnel oxide film and the polysilicon film 6 serving as the floating gate are deposited as the base layers. In addition, the silicon nitride film (the first film) 11 is formed on the base layer. The fabrication method heretofore is the same as described in the second embodiment.

Figure 12B:
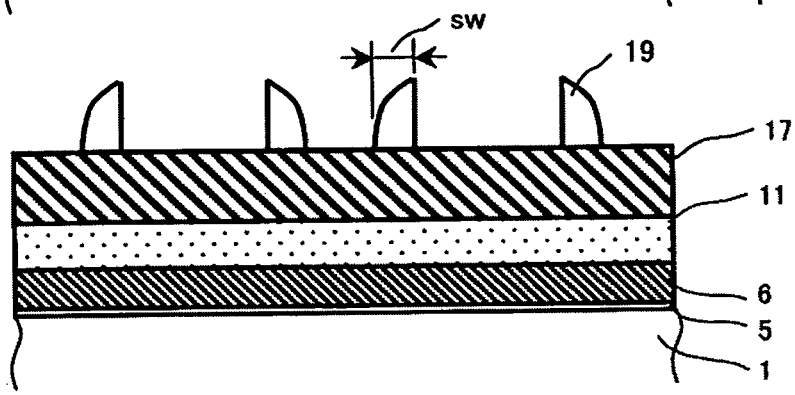
Figure 12C:
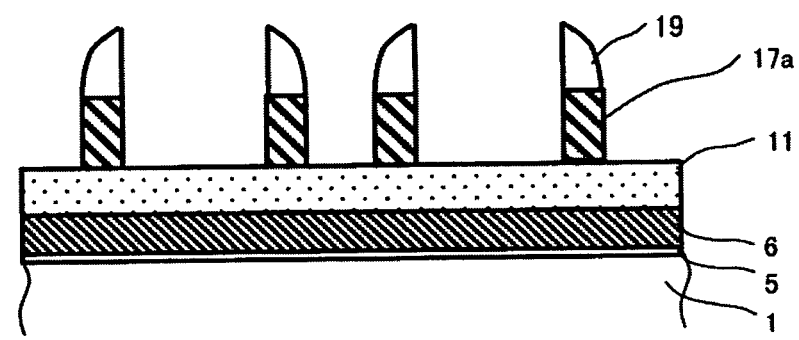
Figure 12D:
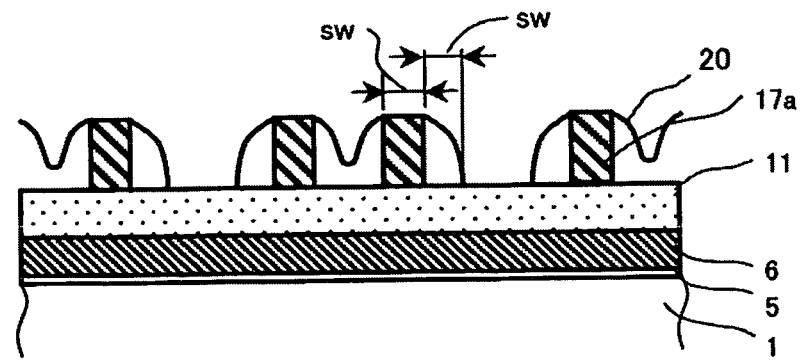

Subsequently, after the polysilicon film (the second film) 17 is deposited, the mask pattern (the first mask pattern) 18 with the minimum process size of F is formed with the silicon nitride film on the polysilicon film 17 at a given pitch. Next, a silicon oxide film (the third film) is deposited and then etched back. As shown in FIG. 12A, sidewall films (the first sidewall films) 19 are formed on the side walls of the mask pattern 18. Then, as shown in FIG. 12B, the mask pattern 18 is etched away so that the sidewall films 19 remains. As shown in FIG. 12C, the polysilicon film 17 is etched by RIE with the sidewall films 19 forming a mask pattern (the second mask pattern) 17a. Then, the mask pattern 19 of the silicon dioxide film is selectively etched and removed in an HF solution or the like. Subsequently, the silicon dioxide (a fourth film) is deposited and then etched back. As shown in FIG. 12D, the sidewall films (the second sidewall films) 20 are formed on the side walls of the mask pattern 17a.

Thus, the bottom width of the sidewall film 20 is configured to be equal to the bottom width of the polysilicon film 16a (FIGS. 11C, 11D), namely, equal to the bottom width sw of the sidewall film 19 illustrated in FIG. 12B. In accordance with this second variation example of the second embodiment of the present invention, the bottom width sw is configured to be approximately F/4.

Figure 13E:
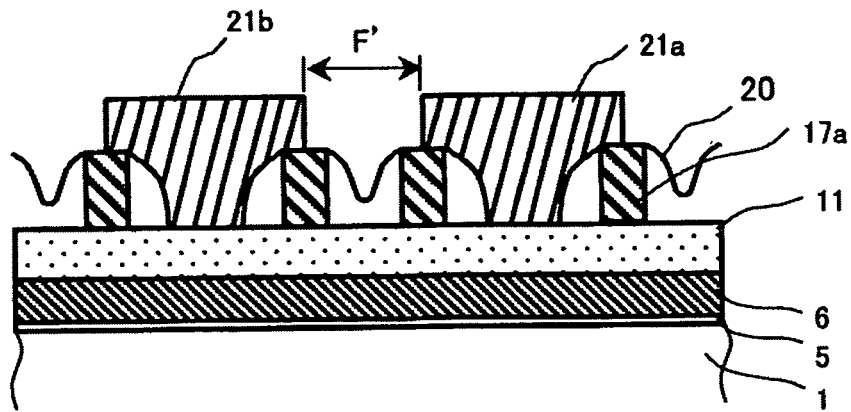
FIGS. 13E through 13H are cross-sectional views of the NAND-type flash memory array in accordance with the second variation example of the first embodiment of the present invention.

Next, as shown in FIG. 13E, photoresists 21a and 21b are sequentially applied on the polysilicon films 17a, respective ends of which are adjacently arranged to each other, and are arranged alternately. Here, a space F' between the photoresists 21a and 21b is smaller than the minimum process size of F, so the photoresists 21a and 21b have to be formed separately and independently. In addition, the photoresists 21a and 21b can be aligned within a margin of the width of the polysilicon film 17a (approximately F/4 in FIG. 13E). As another variation of the fabrication method, if it is desired that the photoresists 21a and 21b should be made at the same time to reduce processing time, the line width and space of the mask 18 (FIG. 12A) are configured to be greater than F, enabling the formation of the photoresist 21a and 21b with a suitable margin. With this method, the pitch of the process pattern of the base layer obtainable in the end is greater than the aforementioned size of F.

Figure 13F:
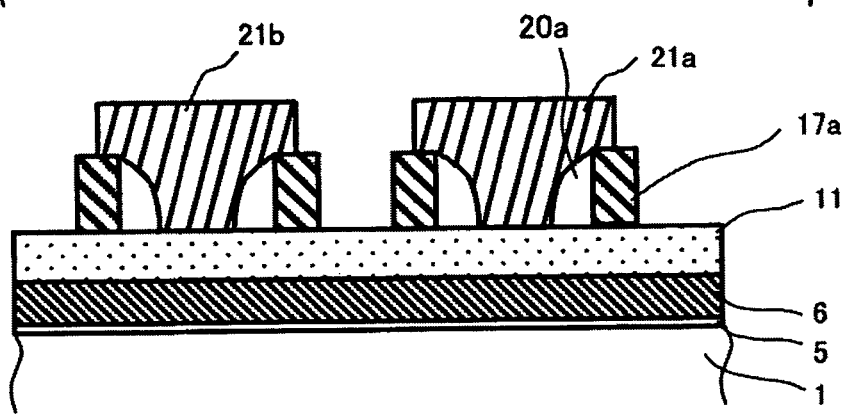
Figure 13G:
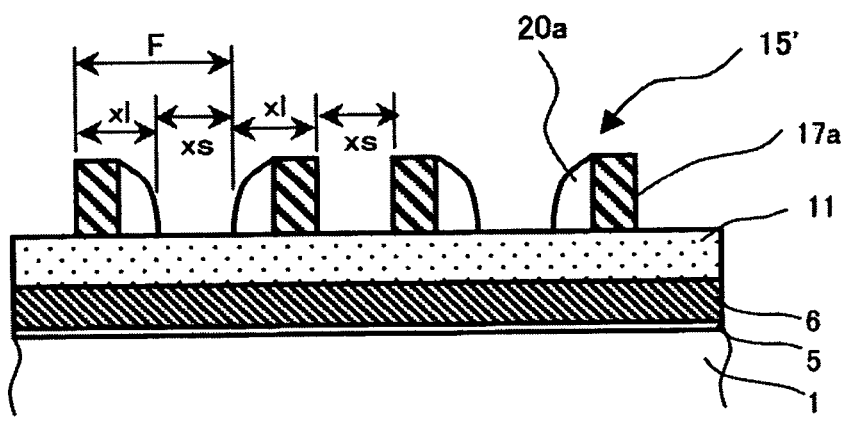

Next, as shown in FIG. 13F, the sidewall films 20 are selectively etched with the photoresists 21a and 21b used for the masks, so that sidewall films 20a only may remain on one of the side walls of the mask patterns 17a. Then, as shown in FIG. 13G, the photoresists 21a and 21b are removed so that the square-shaped polysilicon film 17a with a width of approximately F/4 and a mask pattern (the third mask pattern) 15' remain after the etch process. The mask pattern 15' is formed on one of the side walls of the polysilicon film 17a and is made up of the sidewall film 20a with a bottom width of approximately F/4. Therefore, the bottom width of the mask pattern 17a is configured to be substantially equal to that of the sidewall film 20a that remains after the etch process, making the bottom width of the mask pattern 15' approximately F/2.

Figure 13H:
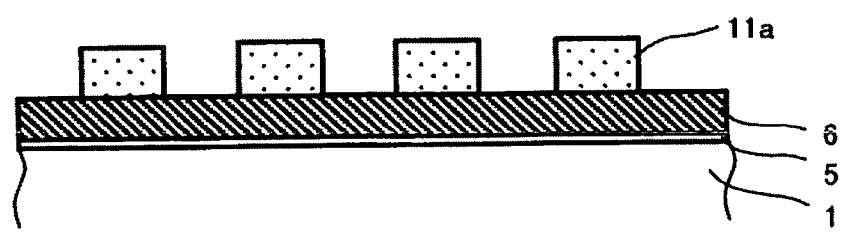

According to the present embodiment, the mask pattern 15' has the bottom width xl and the space xs, which are respectively equal to approximately F/2. However, it is possible to form the mask pattern 15' to have a desired line width and space by adjusting the bottom widths sw thereof when the above-mentioned two sidewall films 19 and 20 are deposited. Next, as shown in FIG. 13H, the silicon nitride film 11 is etched by RIE using the mask pattern 15', and then the mask pattern 15' is selectively etched to form a mask pattern (the fourth mask pattern) 11a of the silicon nitride film. In subsequent processing, the silicon dioxide film 5 and the polysilicon film 6 serving as the base layers are etched with the mask pattern 11a, and the STI and the floating gate are provided in the same fabrication method as described above in regards to the second embodiment of the present invention. In addition, after the process of forming the mask pattern 15' (FIG. 13 G), the silicon nitride film 11 serving as the first film, the silicon dioxide film 5 serving as the base layer, and the polysilicon film 6 may be etched simultaneously by using the mask pattern 15'.

According to the second variation example of the second embodiment of the present invention as described, it is possible to form the mask pattern at a pitch of F in an alternate fabrication method, different from the fabrication method described in accordance with the first and second embodiments. In the present embodiment, while a description has been given of a method of forming the STI, it is readily understood that this method is applicable to processing any line such as the bit line.

The description has been already given, with reference to FIGS. 11A through 11E, of the method of additionally forming the stopper film 16 on the silicon nitride film 11 provided on the base layer, as the first variation example of the second embodiment of the present invention. Hereinafter, a description will be given, with reference to FIGS. 16A through 16D and 17E through 17H, of an additional fabrication process for additionally forming the stopper film 16 on the silicon nitride film 11 provided on the base layer. FIGS. 16A through 16D and 17E through 17H show cross-sectional views of the NAND-type flash memory array to be fabricated in accordance with a third variation example of the second embodiment of the present invention.

Figure 16A:
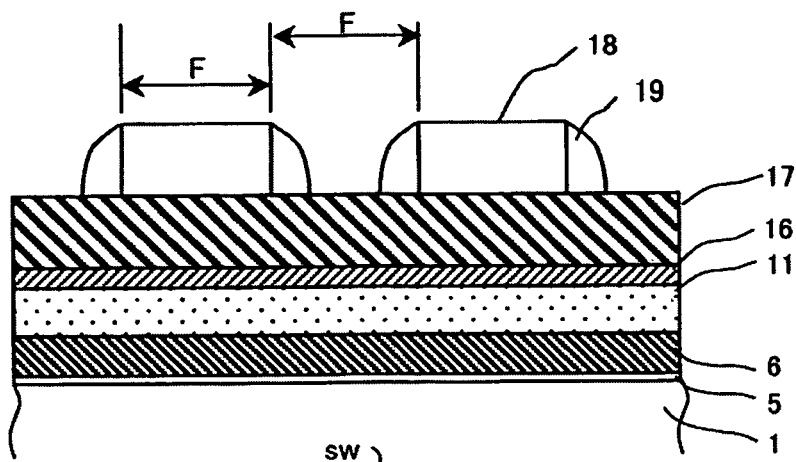
FIGS. 16A through 16D are cross-sectional views of the NAND-type flash memory array in accordance with a third variation example of the second embodiment of the present invention.

First, referring to FIG. 16A, on the silicon substrate 1, the silicon dioxide film 5 to serve as the tunnel oxide film and the polysilicon film 6 to serve as the floating gate are deposited, together forming a base layer. Additionally, the silicon nitride film 11 and the tungsten film 16 are successively deposited on the base layer. The tungsten film 16 is used as a stopper film so that the silicon nitride film 11 provided on the base layer may not be etched during the etch process for forming a mask pattern 15".

Figure 16B:
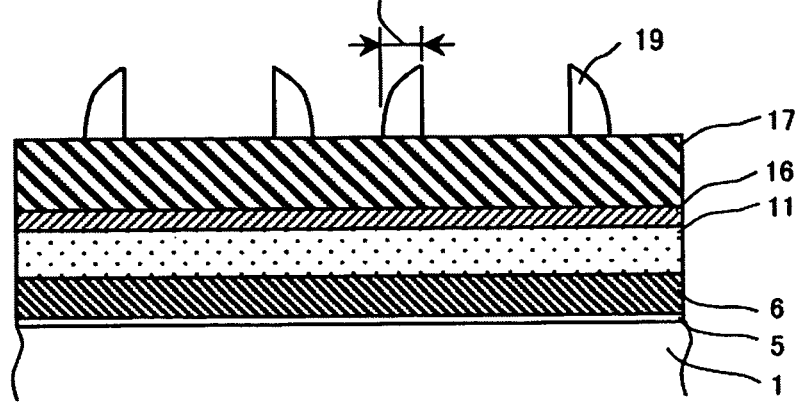
Figure 16C:
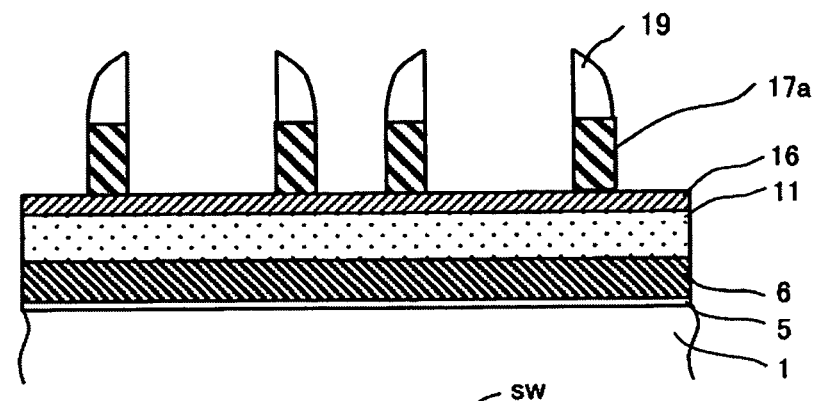
Figure 16D:
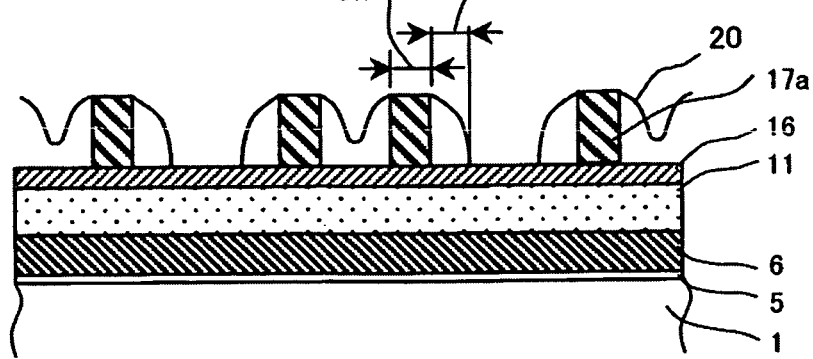

Subsequently, the polysilicon film 17 is deposited on the tungsten film 16 and the mask pattern 18 with a minimum process size of F is formed with a silicon nitride film on the polysilicon film 17 at a given pitch. Then, a silicon oxide film is deposited and etched back, forming, as shown in FIG. 16A, the sidewall films 19 formed on the side walls of the mask pattern 18. Next, as shown in FIG. 16B, the mask pattern 18 is etched away while allowing the sidewall films 19 to remain. Then, as shown in FIG. 16C, the polysilicon film 17 is etched by RIE while masked by the sidewall films 19 to form the mask pattern 17a. Next, the sidewall films 19 of the silicon dioxide film are selectively etched and removed in an HF solution or the like, and silicon dioxide is deposited and then etched back to form, as shown in FIG. 16D, the sidewall films 20, provided on the side walls of the mask pattern 17a.

In accordance with the third variation example of the second embodiment of the present invention, the bottom width of the sidewall film 20 is configured to be equal to the bottom width of the polysilicon film 16a (FIGS. 11C and 11D), namely, to be equal to the bottom width sw of the sidewall film 19 as illustrated in FIG. 12B. In accordance herewith, the bottom width sw is configured to be approximately F/4.

Figure 17E:
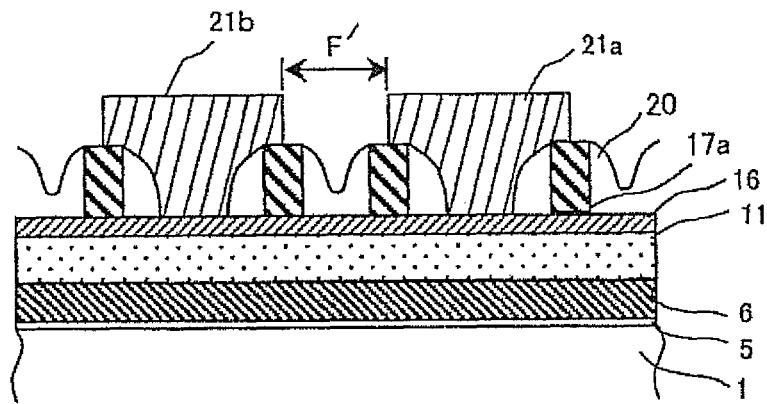
FIGS. 17E through 17H are cross-sectional views of the NAND-type flash memory array in accordance with the third variation example of the second embodiment of the present invention.

Next, as shown in FIG. 17E, the photoresists 21a and 21b are sequentially applied on the polysilicon films 17a, respective ends of which are adjacently arranged to each other, and are arranged alternately. In accordance herewith, a space F' between the photoresists 21a and 21b is smaller than the minimum process size of F, so the photoresists have to be made separately and independently. The photoresists 21a and 21b can be aligned within the margin of the width of the polysilicon film 17a (approximately F/4 in FIG. 17E).

Figure 17F:
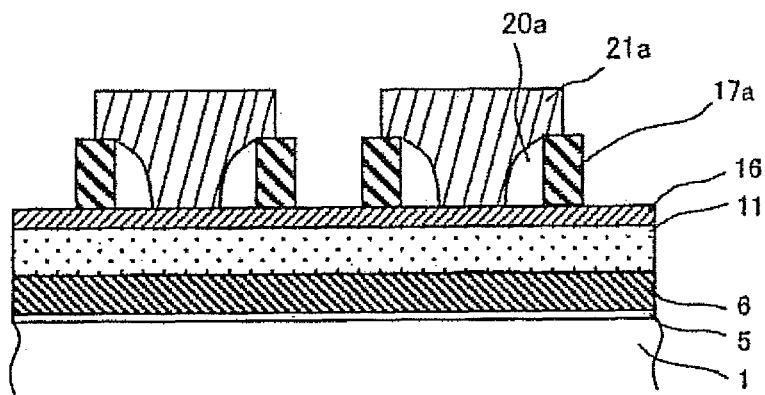
Figure 17G:
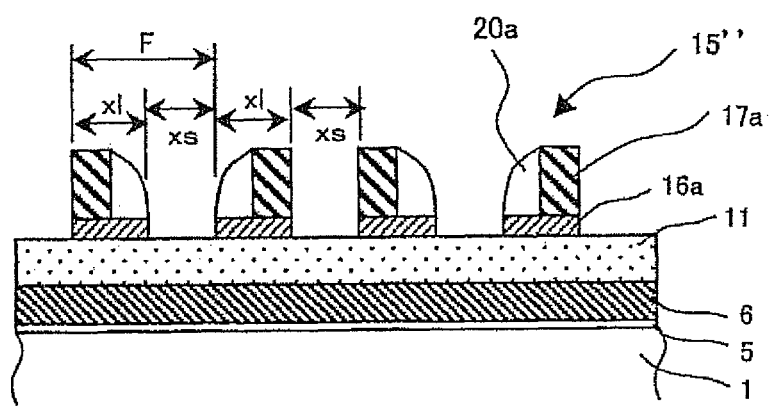

Next, as shown in FIG. 17F, the sidewall films 20 are selectively etched such that sidewall films 20a only remain on one of the side walls of the mask patterns 17a, with the photoresists 21a and 21b used as masks. Then, as shown in FIG. 17G, the photoresists 21a and 21b are removed so that the square-shaped polysilicon film 17a with a width of approximately F/4 and a mask pattern 15" remain after the etch process. The mask pattern 15" is formed on one of the side walls of the polysilicon film 17a and is made up of the sidewall film 20a with a bottom width of approximately F/4. Therefore, the bottom width of the mask pattern 17a is configured to be substantially equal to that of the sidewall film 20a that remains after the etch process, making the bottom width of the mask pattern 15" is approximately F/2.

Figure 17H:
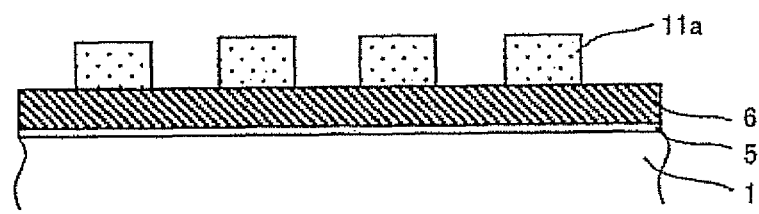

Next, referring to FIG. 17H, the silicon nitride film 11 is etched by RIE using the mask pattern 15", and then the mask pattern 15" is selectively etched to form a mask pattern 11a of the silicon nitride film. In subsequent processing, the silicon dioxide film 5 and the polysilicon film 6 serving as the base layers are etched with the mask pattern 11a, and the STI and the floating gate are created in the same fabrication method as described above in regards to the second embodiment of the present invention. In addition, after the process of forming the mask pattern 15" (FIG. 17G), the silicon nitride film 11 serving as the first film, the silicon dioxide film 5 serving as the base layer, and the polysilicon film 6 may be etched simultaneously by using the mask pattern 15'.

According to the third variation example of the second embodiment of the present invention as described, it is possible to form the mask pattern at a pitch of F in an alternate fabrication method, different from the fabrication method described in accordance with the first and second embodiments. In the present embodiment, while a description has been given of a method of forming the STI, it is readily understood that this method is applicable to processing any line such as the bit line.

A description will be given, with reference to FIGS. 18A through 18D and 19E, of a fourth variation example of the second embodiment of the present invention. FIGS. 18A through 18D and 19E are cross-sectional views of the NAND-type flash memory array to be fabricated in accordance with the fourth variation example of the second embodiment of the present invention. First, referring to FIG. 18A, on the silicon substrate 1, the silicon dioxide film 5 serving as the tunnel oxide film, the polysilicon film 6 serving as the floating gate, the second gate insulating film 7 having an ONO stack, the polysilicon film 8a, the tungsten silicide layer 8b, a silicon dioxide film 25, the silicon nitride film 11, and the tungsten film 16 are successively deposited. The silicon dioxide film 5, the polysilicon film 6, the second gate insulating film 7, the polysilicon film 8a, and the tungsten silicide layer 8b are the base layers. The polysilicon film 8a and the tungsten silicide layer 8b are formed into a control gate 8, which serves as the word line.

Subsequently, in the photolithography process, the mask pattern 12 (FIG. 11A) with the line width and space of the minimum process sizes of F is formed with the polysilicon film to have the thickness of approximately F/2. Next, a mask pattern 15''' comprising the three sidewall films 13a, 14a, and 14b is formed with a silicon dioxide film. The tungsten film 16 is used as a stopper film so that the silicon nitride film 11 provided on the base layer may not be etched during the etch process for forming the mask pattern 15'''. The tungsten film 16 is then etched with the mask pattern 15''' by RIE to form the mask pattern 16a.

Figure 18A:
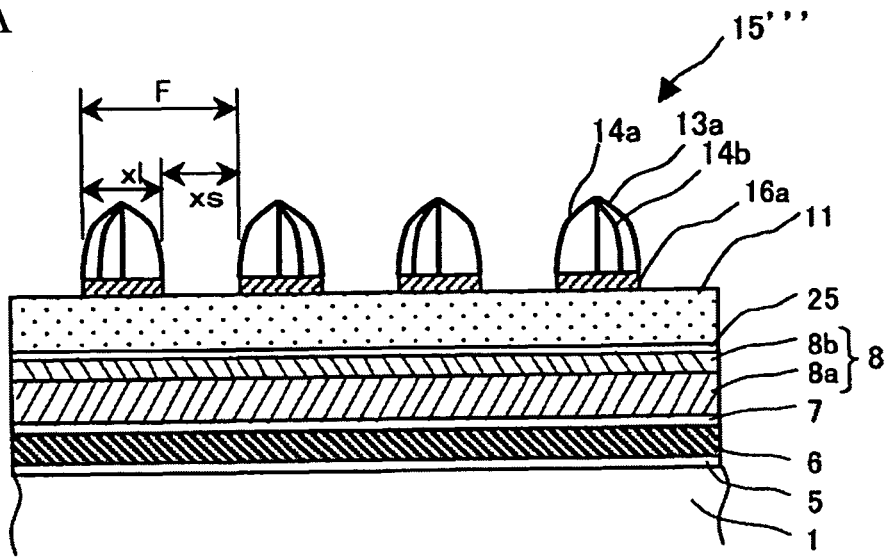
FIGS. 18A through 18D are cross-sectional views of the NAND-type flash memory array in accordance with a fourth variation example of the second embodiment of the present invention.
Figure 18B:
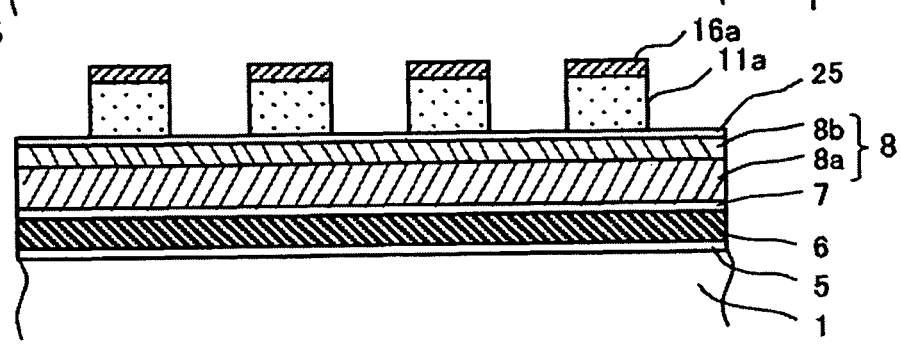
Figure 18C:
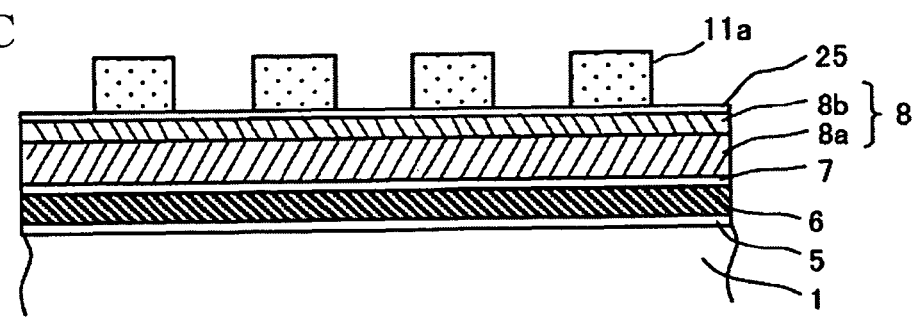
Figure 18D:
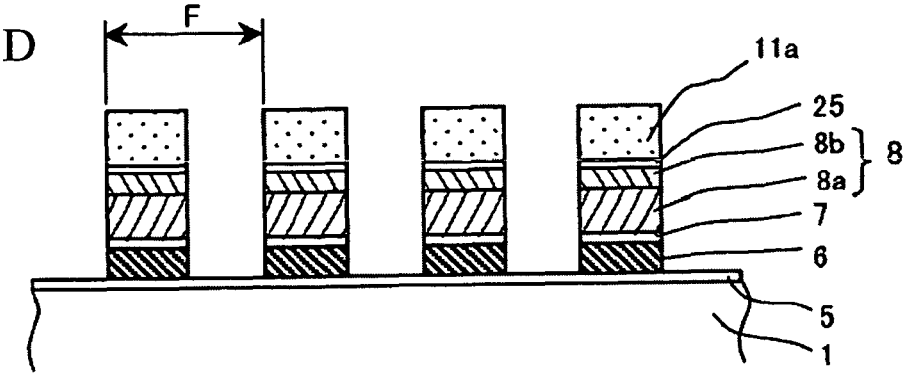

Then, as shown in FIG. 18B, the mask 15''' of the silicon dioxide film is etched away in a HF solution. The silicon nitride film 11 is etched by RIE with the tungsten film 16a that is exposed serving as the mask, and the mask pattern 11a of the silicon nitride film is formed. Next, as shown in FIG. 18C, the tungsten film 16a is removed. Then, as shown in FIG. 18D, the polysilicon film 6, the second gate insulating film 7, the polysilicon film 8a, the tungsten silicide layer 8b, and the silicon dioxide film 25 are etched.

Figure 19E:
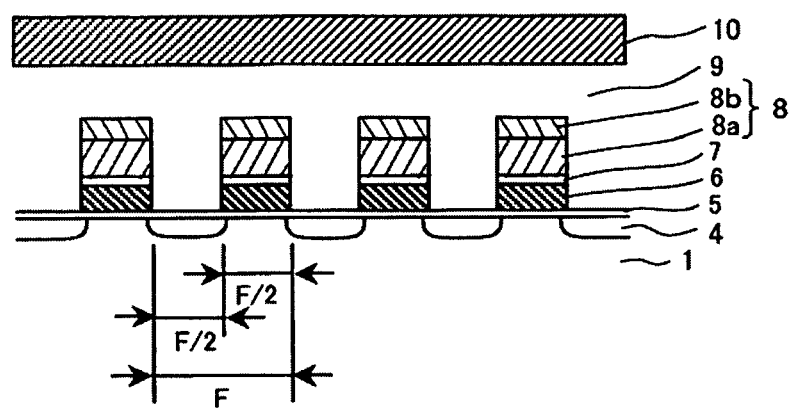
FIG. 19E is a cross-sectional view of the NAND-type flash memory array in accordance with the fourth variation example of the second embodiment of the present invention.

Next, as shown in FIG. 19E, the mask pattern 11a has been etched and removed during a CMP process. The n-type diffusion layers 4 serving as the source/drain regions of the cell transistor are formed by ion implantation in the surface of the silicon substrate 1. After the BPSG film 9 is deposited, the contacts are opened and the bit line 10 is formed in the method as described in regards to the first embodiment (FIG. 5).

In accordance with the embodiments described above, it is possible to form the stripe pattern with the line width and the line space having the same sizes, at a pitch that is the same as the minimum process size determined by the photolithographic performance. In addition, it is possible to fabricate a NAND-type flash memory having a cell size that is one-fourth that of a NAND-type flash memory fabricated by conventional methods.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method for fabricating a semiconductor device comprising:
    forming a first film on a base layer;
    forming a first mask pattern on the first film, the first mask pattern having first mask portions and sidewalls, wherein a width of each of the first mask portions and a space between adjacent first mask portions are the same;
    forming first sidewall films on the sidewalls of the first mask pattern by etch back of a deposited second film, each of the first sidewall films comprising a vertical side surface and a curved side surface;
    removing the first mask pattern;
    forming second sidewall films by etchback of a deposited third film on the first sidewall films, the second sidewall films comprising first portions adjacent to the vertical side surfaces and second portions adjacent to the curved side surfaces of the first sidewall films;
    wherein the first portions of the second sidewall films have a width of one-quarter the width of each first mask portion, and wherein the first sidewall films and the second sidewall films define portions of a second mask pattern.

2. The method as claimed in claim 1, further comprising:
    forming the second mask pattern on the first film disposed over the base layer.

3. The method as claimed in claim 2, further comprising:
    forming a first gate insulating film and a first conductive layer on a semiconductor substrate to form the base layer; and
    etching the base layer with the second mask pattern, wherein the second mask pattern is selectively etched to form a third mask pattern, and wherein using the third mask pattern to selectively etch the base layer so that a trench reaching the semiconductor substrate is formed.

4. The method as claimed in claim 1, wherein the first film, the first mask pattern, the second film and the third film are respectively either insulating films or polysilicon films.

5. The method as claimed in claim 1, wherein each of the portions of the second mask pattern has a width that is half the width of each first mask portion.

6. The method as claimed in claim 2, further comprising:
    forming a third mask pattern by etching the first film having the second mask pattern; and
    etching the base layer with the third mask pattern after removal of the second mask pattern.

* * * * *